Jan. 20, 1970 G. E. WITSELL 3,491,251

LOGIC CIRCUIT HAVING NOISE IMMUNITY CAPABILITY WHICH EXCEEDS ONE-HALF THE LOGIC SWING IN BOTH DIRECTIONS

Filed Dec. 20, 1965 2 Sheets-Sheet 1

INVENTOR.
George E. Witsell

BY
Mueller, Aichele & Rauner

ATTY'S.

Jan. 20, 1970 G. E. WITSELL 3,491,251

LOGIC CIRCUIT HAVING NOISE IMMUNITY CAPABILITY WHICH EXCEEDS ONE-HALF THE LOGIC SWING IN BOTH DIRECTIONS

Filed Dec. 20, 1965 2 Sheets-Sheet 2

INVENTOR.
George E. Witsell

BY Mueller, Aichele & Rauner

ATTY'S.

United States Patent Office 3,491,251
Patented Jan. 20, 1970

3,491,251

LOGIC CIRCUIT HAVING NOISE IMMUNITY CAPABILITY WHICH EXCEEDS ONE-HALF THE LOGIC SWING IN BOTH DIRECTIONS

George E. Witsell, Phoenix, Ariz., assignor to Motorola, Inc., Franklin Park, Ill., a corporation of Illinois Filed Dec. 20, 1965, Ser. No. 514,966
Int. Cl. H03k 9/08
U.S. Cl. 307—215 7 Claims

ABSTRACT OF THE DISCLOSURE

A logic circuit having an improved noise immunity capability is described. The logic circuit contains an offset resistor which in combination with a current supply establishes a threshold for the input logic signal. When the input signal increases beyond the threshold, the current supply is disabled and the effect of the offset resistor is reduced. The threshold can be varied to provide immunity to noise having a magnitude in excess of fifty percent of the logic swing.

Figure 1:
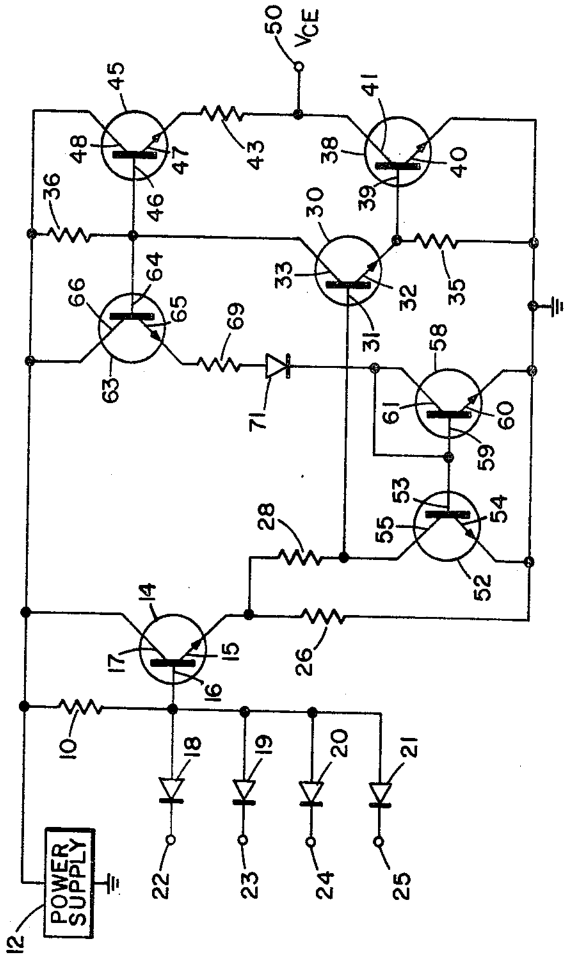

This invention relates to logic circuits and in particular to logic circuits having a high noise immunity in each direction of logic swing.

Logic circuits used in computers or control circuitry require a high immunity to noise so they will not be subject to false operation. This is particularly true where the control circuits operate with or near mechanical systems. This environment creates a large noise problem for the control circuitry because of inductive transients and contact noise generated by the electro-mechanical components in their normal operation.

Prior art devices have provided for noise immunity by requiring that the input signal be higher than a predetermined threshold before operation of a logic circuit can occur. However, in normal operation the threshold point is not made greater than 50% of the logic swing since increasing the threshold point to a value greater than 50% in one direction of logic swing results in a threshold point less than 50% in the opposite direction of logic swing. Thus, the noise immunity may be 70% in one direction and only 30% in the opposite direction of logic swing. Noise immunity has also been provided by using a logic circuit having a high input power requirement so that noise signals will not have enough energy to cause operation of the logic circuit.

It is, therefore, an object of this invention to provide an improved logic circuit having a noise immunity greater than 50% in each direction of logic swing.

Another object of this invention is to provide an improved logic circuit having a high noise immunity in each direction of logic swing and being capable of operating with a single power supply with low power dissipation and low input power requirements.

A feature of this invention is the provision of a logic circuit having a high noise immunity and in which a current supply and offset resistor are provided to develop an offset voltage which must be overcome before a threshold point is reached in the logic swing.

Another feature of this invention is the provision of an improved logic circuit and in which the current supply is effectively switched out of the circuit when the input logic swing has reached its threshold point so that the current supply is no longer effective to provide the offset voltage.

Figure 2:
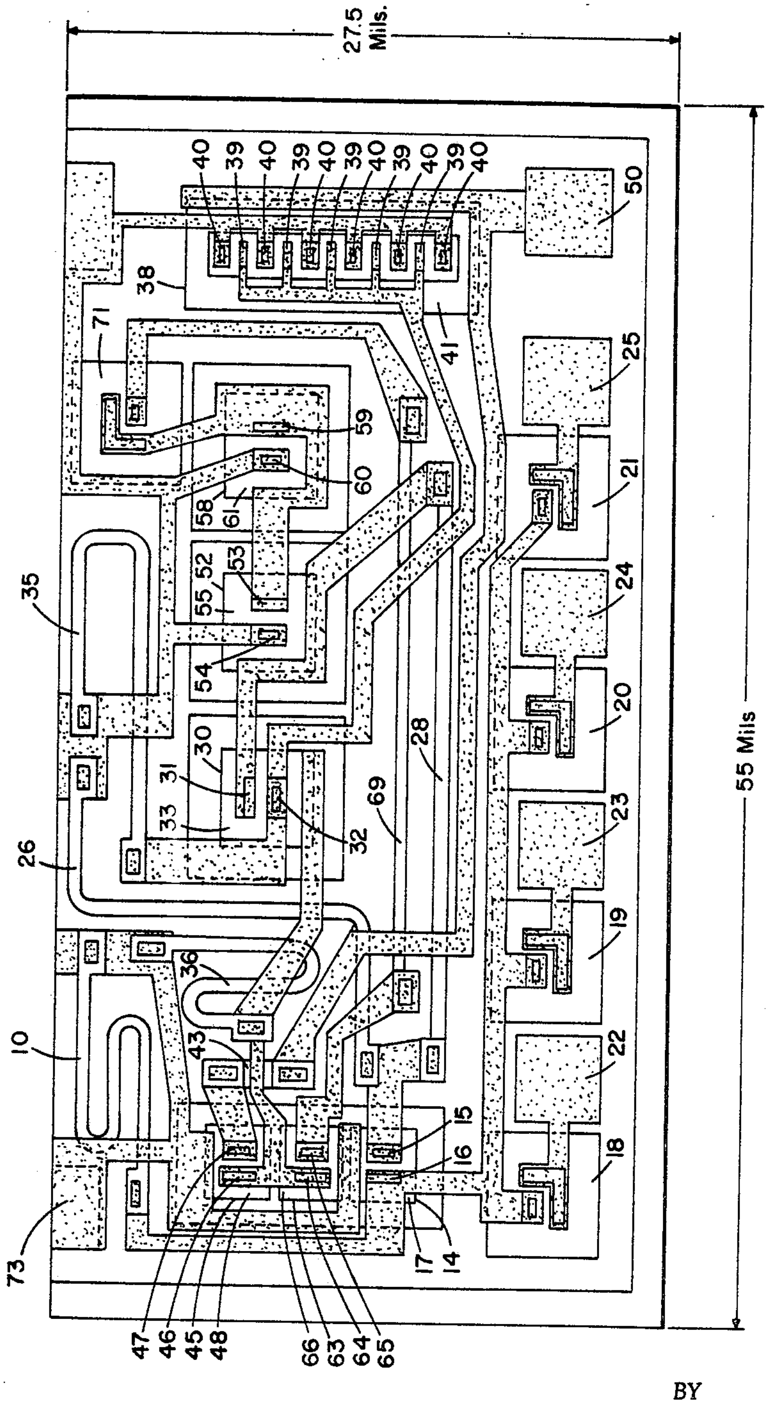

The circuit is illustrated in the drawings of which;

FIG. 1 is a schematic of a circuit incorporating the features of the invention; and FIG. 2 is a drawing of an integrated circuit die incorporating the structure of the circuit of FIG. 1.

In practicing this invention a logic gate circuit is provided with an input circuit adapted to receive an input logic signal having a predetermined logic swing between minimum potential and a maximum potential. An offset resistor couples the input circuit to the logic gate circuit. A current supply is provided which is coupled to the offset resistor to develop a voltage drop across the offset resistor which prevents the voltage at the input to the logic gate circuit from changing until the input logic signal has reached a predetermined potential. When this occurs the logic gate circuit changes its state and also effectively causes the current supply to be switched out of the circuit. When the logic swing goes from the maximum potential to the minimum potential, the bias voltage is such that the logic voltage must reach a predetermined threshold point before the gate will switch. In each direction of logic swing the threshold point can be adjusted to give a noise immunity greater than 50%.

Referring to FIG. 1, resistor 10 and diodes 18, 19, 20 and 21, coupled to input terminals 22, 23, 24 and 25, form an AND circuit which is coupled to base 16 of transistor 14. Resistor 10 and collector 17 of transistor 14 are coupled to power supply 12. Transistor 14 is connected as an emitter follower with emitter 15 coupled to emitter follower resistor 26. The output of transistor 14 is taken from emitter 15 and coupled to base 31 of transistor 30 by offset resistor 28. Collector 33 of transistor 30 is coupled to the power supply 12 by resistor 36 and emitter 32 of transistor 30 is coupled to a reference potential by resistor 35. Collector 48 of transistor 45 is coupled to power supply 12 and emitter 47 of transistor 45 is coupled to output terminal 50 by resistor 43. Base 46 of transistor 45 is coupled to collector 33 of transistor 30. Collector 41 of transistor 38 is coupled to output terminal 50 and emitter 40 of transistor 38 is coupled to the reference potential. Base 39 of transistor 38 is coupled to emitter 32 of transistor 30.

A first current supply is formed by resistor 69, diode 71 and transistor 58. Transistor 63 acts as a switch coupling the first current supply to power supply 12. Collector 66 of transistor 63 is coupled to power supply 12 and emitter 65 of transistor 63 is coupled to diode 71 by resistor 69. Base 64 of transistor 63 is coupled to collector 33 of transistor 30. Diode 71 is coupled to collector 61 and base 59 of transistor 58. Emitter 60 of transistor 58 is coupled to the reference potential. A second current supply is formed by transistor 52. Collector 55 of transistor 52 is coupled to offset resistor 28 and base 53 of transistor 52 is connected to base 59 of transistor 58. Emitter 54 of transistor 52 is coupled to the reference potential.

The operation of the first and second current supplies is as follows: With transistor 63 biased to conduction a current flows through collector 66, emitter 65 of transistor 63, resistor 69, diode 71 and transistor 58 connected as a diode. The flow of current through transistor 58 develops a voltage at base 59 which is applied to base 53 of transistor 52. Assuming that the geometries and current gains of transistors 52 and 58 are the same, transistor 52 will attempt to carry a current equal to the current flowing through transistor 58. While the current flow through transistor 52 may be limited to a value less than the flow of current through transistor 58, no more current can flow through transistor 52 than is flowing through transistor 58. By changing the ratios of the areas of the emitters of transistors 52 and 58 the ratios of the current flow through each of these transistors can be varied. However, once the flow relation is established the flow of current through transistor 52 cannot exceed a maximum magnitude which is proportional to the flow of current through transistor 58.

In following the operation of the logic circuit, assume that a high logic signal has been received so that transistor 30 is biased to conduction. Biasing transistor 30 to conduction produces a low potential on base 46 of transistor 45 and a high potential on base 39 of transistor 38. Thus, transistor 38 is biased to conduction and transistor 45 is biased to non-conduction. Output terminal 50 is coupled to the reference potential through fully conductive transistor 38. The low potential on base 46 of transistor 45 also appears on base 64 of transistor 63 causing transistor 63 to be cut off. With transistor 63 off no current flows through the current source and through transistors 58 and 52.

As the logic signal at the input terminals 22 through 25 is reduced the logic potential on base 31 of transistor 30 also decreases. This will continue until the potential on base 31 of transistor 30 reaches a value approximately equal to $2V_{BE}$ where $V_{BE}$ is the base emitter voltage drop of the transistors of the circuit. When this potential is reached the conduction through transistor 30 becomes less causing the potential at base 64 of transistor 63 to rise. The rise of potential at base 64 permits a current to flow through transistor 58 and also, as previously described, a current will flow through transistor 52. The current flow through transistor 52 also flows through offset resistor 28 causing a voltage drop across this transistor further lowering the logic potential appearing at base 31 of transistor 30. This regenerative action continues until transistor 30 is fully switched and is non-conductive. With transistor 30 non-conductive, transistor 45 is biased to conduction and transistor 38 is biased to non-conduction. Output terminal 50 is coupled to power supply 12 through transistor 45 and resistor 43. Transistor 63 is biased fully on and a maximum current flows through transistor 58.

When the logic swing reverses and goes from minimum to maximum potential the output potential at emitter 15 of transistor 14 is coupled to base 31 of transistor 30 through offset resistor 28. The current flowing through transistor 52 produces an offset voltage across offset resistor 28 reducing the potential applied to base 31 of transistor 30. Thus, base 31 of transistor 30 is effectively clamped to a low potential until the current flowing through transistor 52 reaches the maximum magnitude previously directed. At this point in the logic swing the voltage appearing on base 31 increases causing transistor 30 to be biased on. When transistor 30 is biased on the potential appearing on base 64 of transistor 63 is reduced causing the current flowing through transistor 58 and 52 to be reduced. This reduction in current flow through transistor 52 causes the voltage drop across the offset resistor 28 to decrease further causing transistor 30 to be biased further to conduction. This regenerative action results in a rapid turn-on of transistor 30 and a rapid turn-off of transistor 63.

The circuit of FIG. 1 is readily adaptable to manufacture in an integrated circuit form. FIG. 2 illustrates the construction of a portion of a monolithic integrated semiconductor die which incorporates the circuit of FIG. 1. The portions of the die corresponding to the circuit elements shown in the schematic of FIG. 1 have the same reference numerals. When formed in this manner the die can be packaged in a standard integrated circuit package with connections being made to terminals 22 to 25 and 50. Power supply 12 is connected to terminal 73.

Thus a logic circuit has been provided which has a high noise immunity in each direction of logic swing. For example, it is possible to provide a noise immunity of 90% in each direction; that is, the threshold point at which switching occurs is 90% of the logic swing. The circuit is capable of operating from a single power supply and has low input power requirements.

I claim:

1. A logic circuit including in combination: input circuit means adapted to receive binary input logic signals, offset impedance means connected to said input circuit means, output circuit means biased conductive for a predetermined binary input signal condition at said input circuit means, said offset impedance means interconnecting said input and output circuit means and providing a signal path therebetween, current supply means connected between said offset impedance means and a point of reference potential, said current supply means drawing a predetermined amount of current through said offset impedance means for providing a voltage drop across said offset impedance means to thereby establish the switching threshold for said output circuit means, and feedback switch means connected between said output circuit means and said current supply means and responsive to a change in the conductive state of said output circuit means for applying regenerative feedback to said current supply means, said current supply means responsive to said regenerative feedback to control the current flow through said offset impedance means and thereby rapidly change the conductive state of said output circuit means.

2. In a logic circuit including input logic circuit means adapted to receive a logic signal, and a power supply terminal, a noise immunity circuit including in combination: a first transistor having a conductive state in which a first bias potential is developed and a nonconductive state in which a second bias potential is developed, said first transistor having an emitter electrode coupled to a point of reference potential, a base electrode and a collector electrode, bias resistance means coupling said collector electrode of said first transistor to said power supply terminal, an offset resistor coupling the input logic circuit means to the base electrode of said first transistor for applying a logic signal thereto, a second transistor having a collector electrode coupled to said power supply terminal, a base electrode coupled to said collector electrode of said first transistor and an emitter electrode, a third transistor having an emitter electrode coupled to a point of reference potential and base and collector electrodes coupled together, a first resistor and a diode series coupled between said emitter electrode of said second transistor and said collector electrode of said third transistor, second transistor being responsive to said first bias potential to become nonconductive and responsive to said second bias potential to couple a power supply at said power supply terminal to said third transistor whereby a first current flows through said third transistor, a fourth transistor coupled to said first and third transistors and to said offset resistor, said fourth transistor having an emitter electrode coupled to a point of reference potential, a base electrode coupled to the base electrode of said third transistor and collector electrode coupled to the base electrode of said first transistor, said fourth transistor being responsive to said first current whereby a second current having a maximum magnitude proportional to said first current is caused to flow through said fourth transistor and through said offset resistor to rapidly change the conductive state of the logic circuit.

3. The logic circuit defined in claim 2 in which the logic circuit structure is formed in a monolithic integrated circuit die.

4. In a logic circuit including input logic circuit means adapted to receive a logic signal, and a power supply terminal, a noise immunity circuit including, in combination: transistor means coupled to the power supply terminal and having a conductive state in which a first bias potential is developed and a nonconductive state in which a second bias potential is developed, said transistor means having an input electrode, a control electrode and an output electrode with said output 10 electrode coupled to a reference potential, bias resistance means coupling said input electrode of said transistor means to said power supply terminal, offset impedance means coupling the input logic circuit means to said control electrode of said transistor means for applying a logic signal thereto, first semiconductor means having an input electrode, an output electrode and a control electrode with said input electrode coupled to the power supply terminal, said control electrode of said first semiconductor means coupled to said transistor means for receiving said first and second bias potentials, first current supply means coupled to said first semiconductor means, said first semiconductor means responsive to said first bias potential to become nonconductive and responsive to said second bias potential to couple a power supply at said power supply terminal to said first current supply means whereby a first current flows through said first current supply means, a second current supply means coupled to said first current supply means, said offset impedance means and said transistor means, said second current supply means being responsive to said first current whereby a second current having a maximum magnitude proportional to said first current is caused to flow therethrough and through said offset impedance means to vary the logic signal coupling action of the logic circuit.

5. A logic circuit including in combination: input circuit means adapted to receive binary input logic signals, offset impedance means connected to said input circuit means, output circuit means biased conductive for a predetermined binary input signal condition at said input circuit means, said output circuit means includes a first transistor having an emitter, a base, and a collector with the base connected directly to said offset impedance means and receiving base current therefrom, current supply means connected between said offset impedance means and a point of reference potential, said current supply means drawing current through said offset impedance means for providing a voltage drop across said offset impedance means to thereby establish the switching threshold for said output circuit means, and feedback switch means connected between said output circuit means and said current supply means and responsive to a change in the conductive state of said output circuit means for applying a regenerative feedback signal to said current supply means, said feedback switch means includes a second transistor having a base, an emitter and a collector, the base of said second transistor connected to the collector of said first transistor and having the base potential thereof controlled by the conduction in said first transistor, the emitter of said second transistor coupled to said current supply means and the conduction of said current supply means being controlled in response to the conduction of said first transistor to thereby rapidly change the conductive state of said current supply means in response to a change in the conductive state of said first transistor, said current supply means responsive to a regenerative feedback signal from said second transistor to control the current flow through said offset impedance means and thereby rapidly change the conductive state of said output circuit means.

6. The logic circuit defined in claim 5 wherein said current supply means is a transistor with a collector connected to said offset impedance means, an emitter connected to a point of reference potential and a base, said logic circuit further including a resistor and a diode serially connected between the emitter of said second transistor and the base of said current supply means.

7. The logic circuit defined in claim 5 which further includes one output transistor cascaded to said first transistor and further connected to a circuit output terminal for enhancing the current gain of the circuit when said first transistor is conducting, and another output transistor connected between said output terminal and said second transistor and biased to conduction as said one output transistor turns off.

References Cited

UNITED STATES PATENTS 3,259,761 7/1966 Narud et al. ---------- 307—215

OTHER REFERENCES

Yourke et al., I.B.M. Technical Disclosure Bulletin, vol. 2, No. 4, December 1959, (pp. 84–85).

DONALD D. FORRER, Primary Examiner

U.S. Cl. X.R.

307—213, 214